United States Patent
Purakh et al.

(10) Patent No.: US 9,899,527 B2
(45) Date of Patent: Feb. 20, 2018

(54) INTEGRATED CIRCUITS WITH GAPS

(71) Applicant: Globalfoundries Singapore Pte. Ltd., Singapore (SG)

(72) Inventors: Raj Verma Purakh, Singapore (SG); Shaoqiang Zhang, Singapore (SG); Rui Tze Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/985,607

(22) Filed: Dec. 31, 2015

(65) Prior Publication Data
US 2017/0194504 A1 Jul. 6, 2017

(51) Int. Cl.
| | | |
|---|---|---|
| H01L 29/78 | (2006.01) | |
| H01L 29/786 | (2006.01) | |
| H01L 21/762 | (2006.01) | |
| H01L 21/764 | (2006.01) | |

(52) U.S. Cl.
CPC ...... *H01L 29/78603* (2013.01); *H01L 21/764* (2013.01); *H01L 21/76251* (2013.01)

(58) Field of Classification Search
CPC .................................................. H01L 29/78603
See application file for complete search history.

(56) References Cited

U.S. PATENT DOCUMENTS

| | | | | |
|---|---|---|---|---|
| 5,982,002 A * | 11/1999 | Takasu | ................ | G02F 1/13454 257/286 |
| 6,211,551 B1 * | 4/2001 | Suzumura | ......... | H01L 23/49562 257/343 |
| 6,373,101 B1 * | 4/2002 | Suzumura | ......... | H01L 23/49562 257/341 |
| 6,599,771 B2 * | 7/2003 | Mashio | ..................... | G01J 5/20 257/E27.136 |
| 6,657,258 B2 * | 12/2003 | Bae | ................... | H01L 21/76264 257/347 |
| 6,927,102 B2 * | 8/2005 | Udrea | ................. | H01L 29/7816 257/E21.382 |
| 7,045,785 B2 * | 5/2006 | Iida | .......................... | G01J 5/08 250/338.1 |
| 7,525,151 B2 * | 4/2009 | Haase | ................. | H01L 27/1203 257/335 |
| 7,585,743 B2 * | 9/2009 | Renna | ................. | B81C 1/00047 257/E21.561 |
| 7,659,178 B2 * | 2/2010 | Cheng | ............... | H01L 29/66545 257/E31.013 |
| 7,919,814 B2 * | 4/2011 | Goto | ................... | B81C 1/00246 257/350 |
| 8,026,596 B2 * | 9/2011 | Singhal | .............. | H01L 23/4824 257/712 |

(Continued)

*Primary Examiner* — Ida M Soward
(74) *Attorney, Agent, or Firm* — Lorenz & Kopf, LLP

(57) ABSTRACT

Integrated circuits and methods of producing such integrated circuits are provided. In one example, an integrated circuit has a working layer that includes a semiconductor substrate. A handle layer underlies the working layer, where a gap is defined in the handle layer such that an upper gap surface underlies the working layer. The gap has a gap area measured along a first plane at the gap upper surface. A switch directly overlies the gap, where the switch has a switch area measured along a second plane parallel with the first plane. The switch area is less than the gap area.

9 Claims, 8 Drawing Sheets

(56) References Cited

U.S. PATENT DOCUMENTS

| | | | | |
|---|---|---|---|---|
| 8,067,740 B2* | 11/2011 | Sasaki | ............... | H01L 27/14669 250/338.4 |
| 8,610,211 B2* | 12/2013 | Furukawa | ................ | H01L 21/84 257/347 |
| 8,698,481 B2* | 4/2014 | Lieber | .................... | B82Y 15/00 257/253 |
| 8,772,832 B2* | 7/2014 | Boutros | ............... | H01L 29/0657 257/192 |
| 8,796,733 B2* | 8/2014 | Seabaugh | ........... | H01L 29/7391 257/183 |
| 8,890,247 B2* | 11/2014 | Bedell | ............... | H01L 21/76898 257/347 |
| 8,994,128 B2* | 3/2015 | Ten Have | ........... | B81C 1/00158 257/414 |
| 9,224,829 B2* | 12/2015 | Wong | ................ | H01L 29/42364 |
| 9,293,472 B2* | 3/2016 | Huang | ................ | H01L 27/1203 |
| 9,583,414 B2* | 2/2017 | Costa | ................ | H01L 23/3737 |
| 2002/0132448 A1* | 9/2002 | Lim | .................. | H01L 21/76264 438/456 |
| 2004/0113228 A1* | 6/2004 | Yamada | ............ | H01L 21/76281 257/507 |
| 2008/0026540 A1* | 1/2008 | Liu | ................... | H01L 21/82380 438/400 |
| 2008/0283877 A1* | 11/2008 | Collonge | .......... | H01L 29/66772 257/254 |
| 2009/0266987 A1* | 10/2009 | Honda | ...................... | G01J 5/02 250/338.4 |
| 2012/0292700 A1* | 11/2012 | Khakifirooz | ............ | H01L 21/84 257/347 |
| 2012/0319181 A1* | 12/2012 | Yin | .................. | H01L 29/66772 257/288 |
| 2013/0062996 A1* | 3/2013 | Udayakumar | .......... | H01L 27/20 310/321 |
| 2014/0084349 A1* | 3/2014 | Schelling | .......... | H01L 29/66477 257/254 |
| 2015/0076559 A1* | 3/2015 | Frohberg | ................ | H01L 21/84 257/190 |
| 2016/0155841 A1* | 6/2016 | Huo | .................. | H01L 29/66325 257/339 |
| 2016/0254177 A1* | 9/2016 | Hebert | .................. | H01L 21/764 438/404 |
| 2016/0293695 A1* | 10/2016 | Xu | ...................... | H01L 29/0649 |

\* cited by examiner

INTEGRATED CIRCUITS WITH GAPS

TECHNICAL FIELD

The technical field generally relates to integrated circuits with gaps and methods of producing the same, and more particularly relates to integrated circuits with gaps that underlie switches, and methods of producing the same.

BACKGROUND

The semiconductor industry is continuously moving toward the fabrication of smaller and more complex microelectronic components with higher performance. The production of smaller integrated circuits requires the development of smaller electronic components, and closer spacing of those electronic components within the integrated circuits. Closer spacing can increase interference between nearby components, where the interference is often referred to as "noise." The "noise" can include resonance harmonics, where the harmonics can increase the impact of the noise. The first harmonic is typically the most extreme, but second and even third harmonics can interfere with the proper operation of certain electronic components. For example, in some cases a switch can be inadvertently activated by harmonics or other electrical influences.

Integrated circuits that utilize radio frequency communications may use silicon on insulator (SOI) substrates to increase the electrical isolation of electronic components. The SOI substrate includes a top semiconductor working layer, a middle buried oxide (BOX) that is an electrical insulator, and a lower handle layer that is typically monocrystalline silicon. SOI substrates with a high resistivity handle layer can significant improve device radio frequency performance. However, the $2^{nd}$ and $3^{rd}$ harmonics are poor at high radio frequency voltages. A trap rich layer inserted between the BOX and the lower handle layer can be used to reduce the $2^{nd}$ and $3^{rd}$ harmonics. Unfortunately, SOI substrates with high resistivity and trap rich handle layers are expensive.

Accordingly, it is desirable to provide integrated circuits with improved electrical isolation of switches, and methods of producing the same. In addition, it is desirable to provide integrated circuits with good electrical isolation using low cost components, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing such integrated circuits are provided. In an exemplary embodiment, an integrated circuit has a working layer that includes a semiconductor substrate. A handle layer underlies the working layer, where a gap is defined in the handle layer such that an upper gap surface underlies the working layer. The gap has a gap area measured along a first plane at the gap upper surface. A switch directly overlies the gap, where the switch has a switch area measured along a second plane parallel with the first plane. The switch area is less than the gap area.

An integrated circuit is provided in another embodiment. The integrated circuit has a working layer that includes a semiconductor substrate. A buried oxide layer underlies the working layer. A handle layer underlies the buried oxide layer, where the handle layer defines a gap underlying the buried oxide layer. A switch overlies the buried oxide layer and the gap.

A method of producing an integrated circuit is provided in yet another embodiment. The method includes forming a switch in a first wafer, where the first wafer includes a semiconductor substrate. A channel is formed in a second wafer, and the first and second wafers are bonded together with the channel facing the first wafer such that a gap is formed underlying the first wafer. The first and second wafers are bonded such that the gap is positioned directly underlying the switch.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
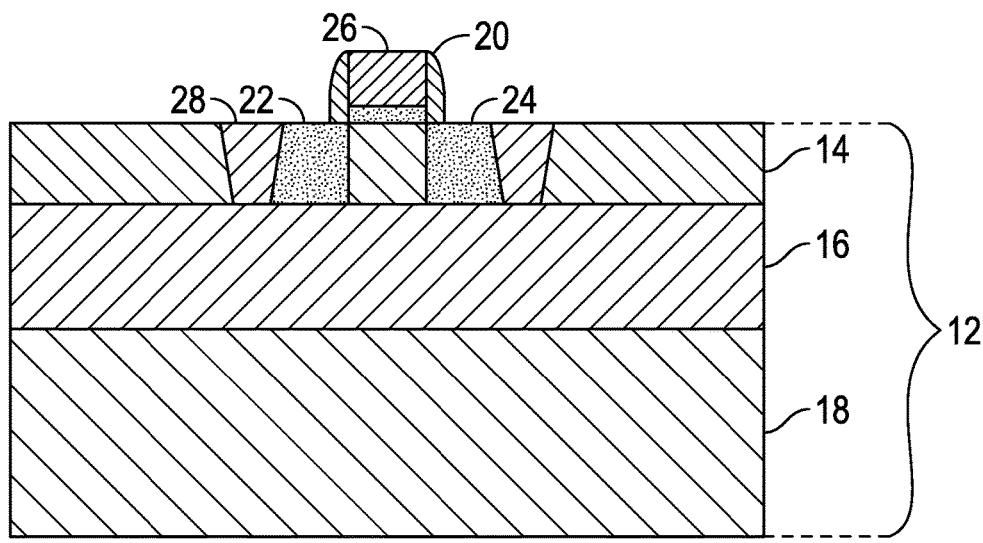
FIGS. 1 through 6 illustrate side sectional views of a portion of an integrated circuit and methods for its manufacture in accordance with exemplary embodiments.

Referring to FIG. 1, an exemplary embodiment of an integrated circuit 10 is formed using a first wafer 12. In one embodiment, the first wafer 12 includes a semiconductor material and serves as a semiconductor substrate for the integrated circuit 10. As used herein, the term 'semiconductor substrate' (sometimes referred to as a "substrate") will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. The semiconductor material is a silicon substrate in some embodiments. The silicon substrate may be a bulk silicon wafer or may be a thin layer of silicon on an insulating layer (commonly known as silicon-on-insulator or SOI) that, in turn, is supported by a carrier wafer.

The first wafer 12 illustrated in FIG. 1 is an SOI with a working layer 14, a buried oxide layer 16 underlying the working layer 14, and a carrier layer 18 underlying the buried oxide layer 16. As used herein, the term "underlying" means "under" such that an intervening layer may lie between the working layer 14 and the buried oxide layer 16, or "on" such that the working layer 14 physically contacts buried oxide layer 16. The working layer 14 includes a semiconductor substrate, the buried oxide layer 16 includes an insulating material, such as silicon dioxide, and the carrier layer 18 includes a semiconductor material such as monocrystalline silicon. As used herein, an "electrically insulating material" is a material with a resistivity of about $1 \times 10^4$ ohm meters or more, and an "electrically conductive material" is a material with a resistivity of about $1 \times 10^{-4}$ ohm meters or less.

A switch 20 is formed overlying the buried oxide layer 16. In an exemplary embodiment, the switch 20 is a field effect transistor with a source 22 formed within the working layer 14, a drain 24 formed within the working layer 14, and a gate 26 formed overlying the working layer. In the illustrated embodiment, the source 22 and the drain 24 extend completely through the working layer 14 such that the source 22 and drain 24 abut the buried oxide layer 16. The switch 20 may be other types of devices in other embodiments, such as a PNP transistor (not illustrated), an NPN transistor (not illustrated), a silicon controlled rectifier (not illustrated), or other devices that are capable of functioning as a switch to allow or block current. As used herein, reference to the switch 20 or any other component or components "allowing" current flow indicates the switch 20 or other component(s) has an "on" resistance of about 1 ohm per millimeter (mm) or less, where the "on" resistance refers to when the component is allowing current flow. The switch 20 or other component(s) "blocking" current flow indicates a resistance of about 2 ohms per mm or greater. Additional electronic components (not illustrated) may also be formed overlying the buried oxide layer 16, where such additional components may utilize the working layer 14 as a substrate. In the illustrated embodiments, the source 22 and drain 24 of the switch 20 are positioned between shallow trench isolations 28. The shallow trench isolation 28 includes an electrically insulating material, such as silicon dioxide, and the shallow trench isolation 28 may be formed through the entire thickness of the working layer 14 in some embodiments. However, in alternate embodiments, the shallow trench isolation 28 may not extend through the entire thickness of the working layer 14, such that a portion of the working layer 14 underlies the shallow trench isolation 28. The switch 20 and shallow trench isolations 28 may be formed using conventional methods and techniques.

Figure 2:
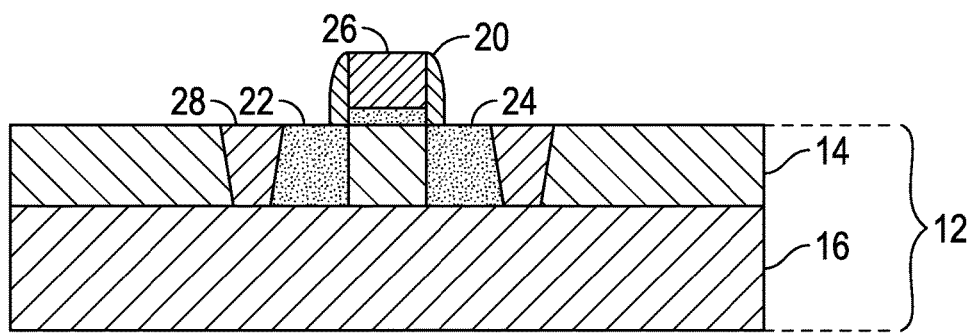

Referring to the embodiment illustrated in FIG. 2 with continuing reference to FIG. 1, the carrier layer 18 of the first wafer 12 is removed. In an exemplary embodiment where the carrier layer 18 primarily includes monocrystalline silicon and the buried oxide layer 16 primarily includes silicon dioxide, the carrier layer 18 may be removed by polishing, but etchants or other techniques may be used in alternate embodiments. As such, the buried oxide layer 16 is exposed on the surface opposite of the working layer 14 after the carrier layer 18 is removed.

Figure 3:
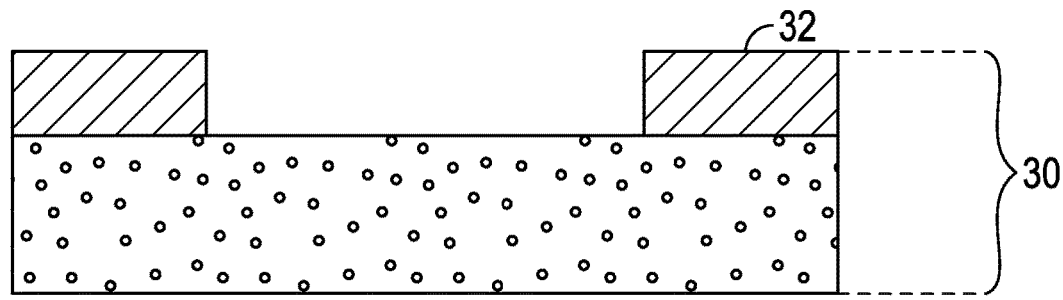

An embodiment of a second wafer 30 is illustrated in FIG. 3. The second wafer 30 may include monocrystalline silicon, or monocrystalline silicon with conductivity imparting ions as described above for a substrate. A second wafer photoresist 32 is formed and patterned overlying the second wafer 30. The second wafer photoresist 32 (and other photoresist layers described below) may be deposited by spin coating and patterned by exposure to light or other electromagnetic radiation through a mask with transparent sections and opaque sections. The light causes a chemical change in the photoresist such that either the exposed portion or the non-exposed portion can be selectively removed. The desired locations are removed with an organic solvent, and the second wafer photoresist 32 remains overlying the other areas of the second wafer 30. The second wafer photoresist 32 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve accuracy during photoresist patterning. Silicon nitride may be used as a hard mask, and may be formed by low pressure chemical vapor deposition using ammonia and dichlorosilane, for example.

Figure 4:
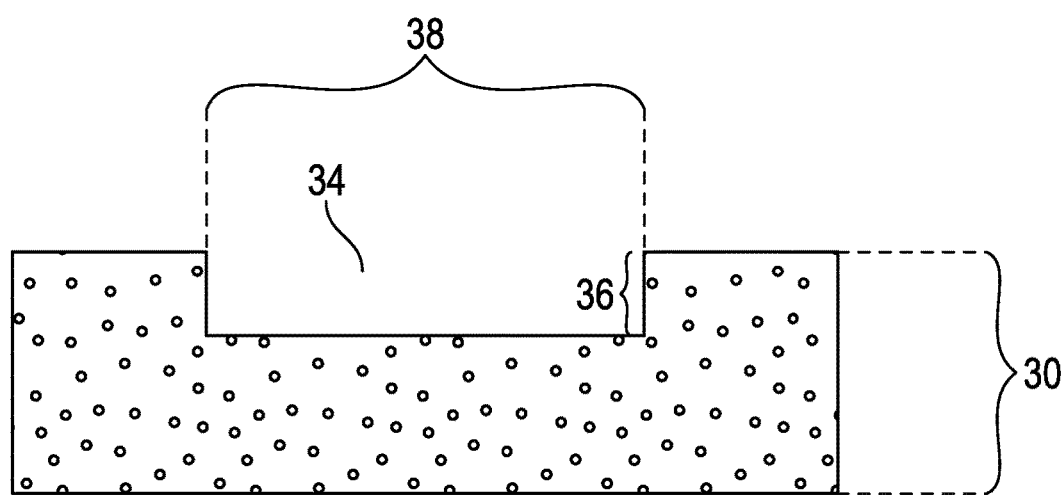

Referring to an embodiment in FIG. 4, with continuing reference to FIG. 3, a channel 34 is formed in the second wafer 30. In an exemplary embodiment, the channel 34 has a channel depth 36 of from about 0.5 to about 10 microns, or from about 1 to about 5 microns, or from about 2 to about 4 microns in various embodiments. The channel 34 may also have a channel width 38 of from about 10 to about 5,000 microns, or from about 20 to about 2,000 microns, or from about 100 to about 1,000 microns in various embodiments. In an embodiment where the second wafer 30 primarily includes monocrystalline silicon, the channel 34 may be formed with a reactive ion etch using carbon tetrafluoride, where a surface of the second wafer 30 underlying the patterned second wafer photoresist 32 is protected from the etching process. Many other etchants and etch techniques can be used in alternate embodiments. The second wafer photoresist 32 may be removed after use with an oxygen containing plasma.

In an exemplary embodiment, the second wafer 30 includes high resistivity silicon, where high resistivity silicon has a resistivity of about 50 ohms per centimeter or greater, or a resistivity of about 1,000 ohms per centimeter or greater, or a resistivity of about 5,000 ohms per centimeter or greater in various embodiments. In alternate embodiments, the second wafer 30 is not high resistivity silicon. High resistivity silicon may be more expensive than silicon that is not high resistivity, but high resistivity silicon may be less expensive than an SOI wafer that includes high resistivity silicon in the carrier layer 18.

Figure 5:
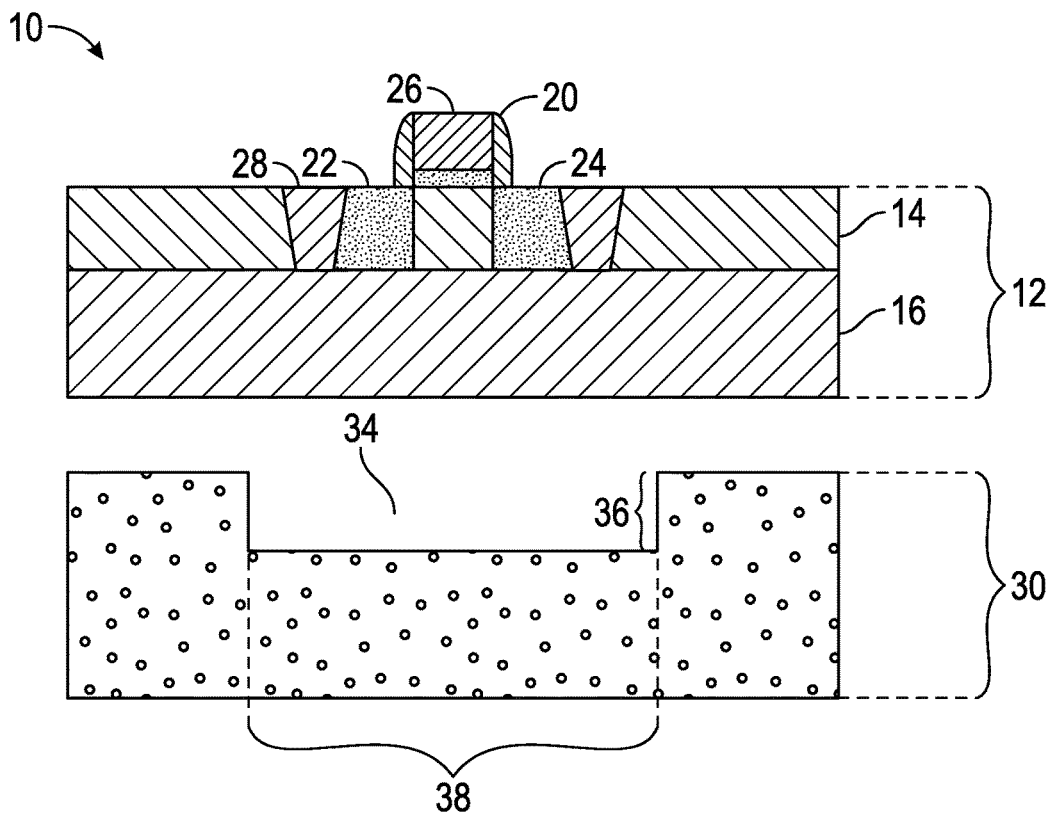
Figure 6:
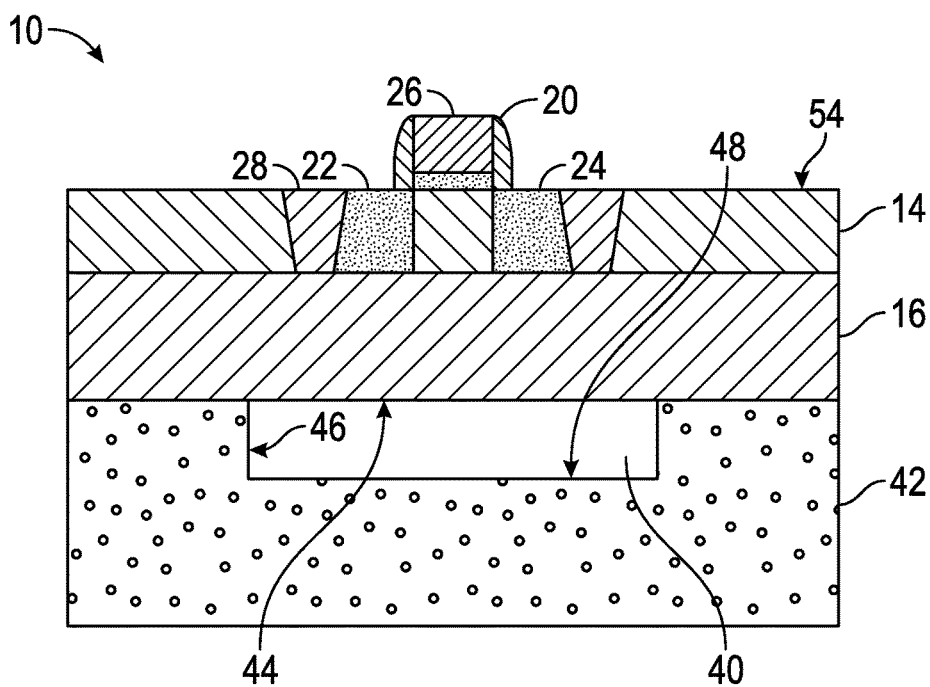

Reference is made to the embodiment illustrated in FIGS. 5 and 6. The first wafer 12 and the second wafer 30 are directly bonded together to form a single piece. The channel 34 faces the first wafer 12 during the bonding process such that the channel 34 forms a gap 40 between the first and second wafers 12, 30 when they are bonded together. Direct bonding can be utilized to join different components without the use of an adhesive. Many different materials can be directly bonded together, and direct bonding is commonly used with silicon. In an exemplary embodiment, the surfaces to be bonded are pre-processed to form very smooth surfaces that are free of particulates that can interfere with the bonding process. The surfaces may be polished and cleaned to remove impurities. A hydrophilic surface may be cleaned with a plasma treatment or ultraviolet and ozone treatments, and then the first and second wafers 12, 30 may be rinsed and/or stored in deionized water. A hydrophobic surface may be prepared by removing native silicon dioxide from the surfaces to be bonded, such as with a plasma treatment or an ammonium fluoride etching solution. In an exemplary embodiment, the surfaces are pre-bonded at room temperature. For hydrophilic surfaces, the pre-bonding includes covering the bonding surfaces with water, aligning the surfaces, and bringing them into contact with each other. For hydrophobic surfaces, the pre-bonding includes covering the bonding surfaces with hydrogen and fluorine atoms followed by alignment and contact. The bonding can then be completed with an annealing step, such as by heating to about 700 degrees centigrade (° C.) or greater, or to about 800° C. or greater, or about 1,000° C. or greater in various embodiments. The bonded surfaces may then be cooled after the annealing step. The second wafer 30 forms a handle layer 42 underlying the working layer 14 after the bonding process, where the handle layer 42 also underlies the buried oxide layer 16 in the embodiment illustrated in FIG. 6

Figure 7:
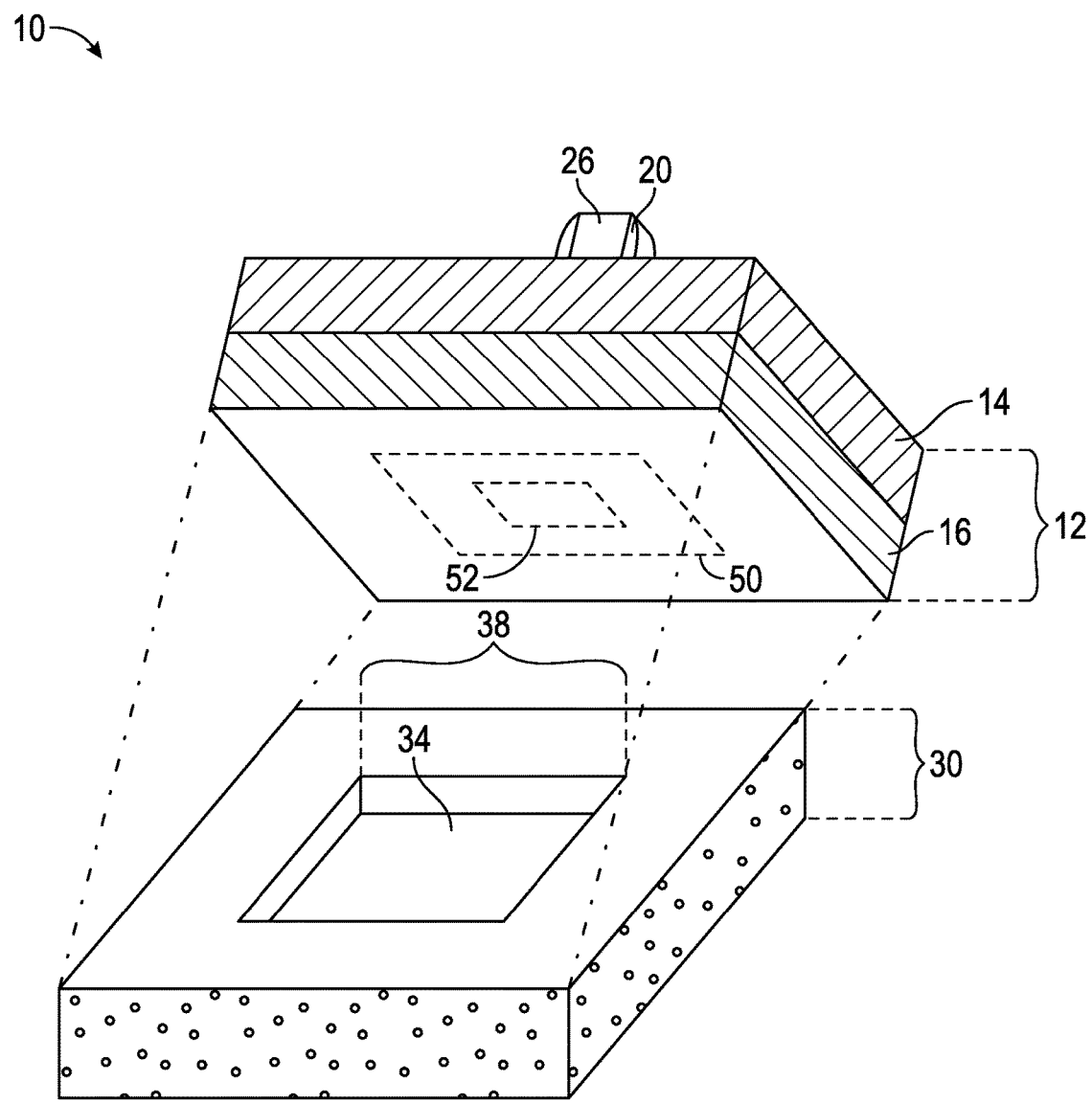
FIG. 7 illustrates an exploded sectional perspective view of a portion of an integrated circuit and methods for it manufacture in accordance with an exemplary embodiment.

Referring to FIG. 7 with continuing reference to FIGS. 5 and 6, the gap 40 is defined in the handle layer 42 directly underlying the switch 20. As used herein, the term "directly underlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to the surface of the working layer 14. In some embodiments, the entire switch 20 directly overlies the gap 40, such that all parts of the switch 20 are positioned directly over the gap 40.

The gap 40 is defined in the handle layer 42 such that an upper gap surface 44 underlies the working layer 14, where the upper gap surface 44 is the buried oxide layer 16 in the embodiment illustrated in FIG. 6. The upper gap surface 44 may be a bottom surface of the working layer 14 (not illustrated in FIG. 6) and therefore underlie the working layer 14 in other embodiments, as described below. Gap side surfaces 46 may be formed from the handle layer 42, and a lower gap surface 48 may be formed from the handle layer 42, as illustrated in FIGS. 6 and 7, but other embodiments are also possible as described below. A gap area 50 is measured along a first plane at the upper gap surface 44. A switch area 52 is measured along a second plane at a working layer top surface 54, and the first and second planes are parallel. Therefore, the switch area 52 and the gap area 50 are measured along parallel planes. The gap area 50 is greater than the switch area, so the entire switch area 52 may be directly overlying the gap area 50. The switch area 52 may be from about 100 square microns to about 1,000 square microns, or from about 1,000 square microns to about 10,000 square microns, or from about 10,000 square microns to about 100,000 square microns in various exemplary embodiments, and the gap area 50 may be from about 200 to about 25,000,000 square microns, or from about 2,000 to about 4,000,000 square microns, or from about 20,000 to about 1,000,000 square microns in various exemplary embodiments. As such, the gap area 50 may be significantly larger than the switch area 52. For example, in various embodiments the gap area 50 may be about 20 times or more greater than the switch area 52, or about 1,000 times or more greater than the switch area 52, or about 1,000,000 times or more greater than the switch area 52. The large gap area 50, relative to the switch area 52, provides significant electrical isolation for the switch 20. In another exemplary embodiment, the gap area 50 extends about 20 microns or more beyond the edges of the switch area 52 in all directions along the upper gap surface 44, such that the gap 40 overlaps the switch 20 so all portions of the switch 20 directly overlie the gap 40.

The gap 40 may be filled with a gap gas, where the gap gas may be air, nitrogen, helium, argon, or a wide variety of other gases. The gap gas has a gap pressure, and the gap pressure may be less than 1 atmosphere in some embodiments, but the gap pressure may be about 1 atmosphere or more than 1 atmosphere in alternate embodiments. Air and many other gases have a very high resistivity, so the gap 40 filled with the gap gas serves to electrically isolate the switch 20 or any other electronic component that may overlie the gap 40. Vacuum has a slightly higher resistivity than air, so a gap pressure of less than 1 atmosphere indicates at least a partial vacuum in the gap 40, where a vacuum in the gap 40 increases the electrical isolation of the overlying switch 20 compared to a higher pressure gas in the gap 40. The gap gas may be incorporated into the gap 40 by being present at the desired pressure when the first and second wafers 12, 30 are bonded together.

Figure 8:
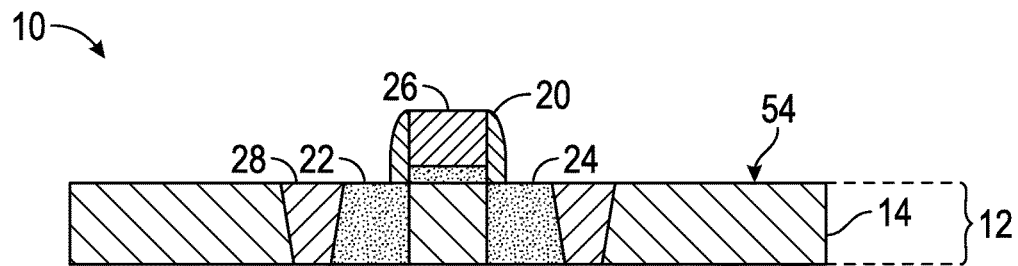
FIGS. 8 through 16 illustrate different embodiments of portions of an integrated circuit and methods for its manufacture in side sectional views.
Figure 9:
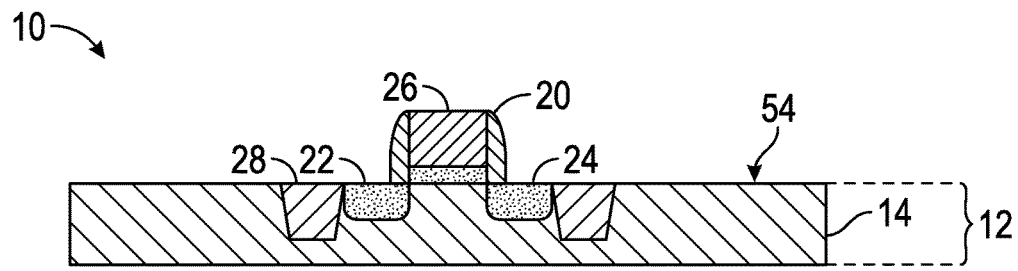
Figure 10:
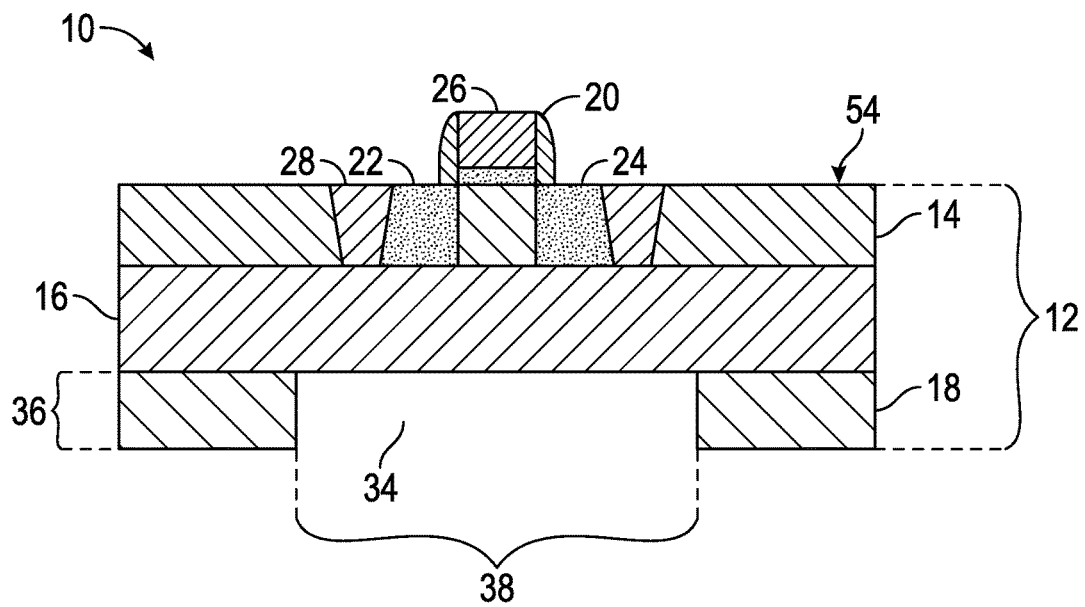

Many other forms of the integrated circuit 10 are possible in various embodiments. FIGS. 8, 9, and 10 illustrate various embodiments of the first wafer 12, and other embodiments are also possible. In FIG. 8, the first wafer 12 includes a working layer 14 but does not include a buried oxide layer 16 (illustrated in FIG. 1). The first wafer 12 in FIG. 9 also includes a working layer 14 but no buried oxide layer 16 (illustrated in FIG. 1), but the source 22 and drain 24 do not pass completely through the working layer 14 in the embodiment illustrated in FIG. 9. The first wafer 12 in FIG. 10 includes a working layer 14 and buried oxide layer 16, but the channel 34 that can be used to form the gap is formed in the carrier layer 18 of the first wafer 12. As such, part of the handle layer 42 (illustrated in FIG. 6) will be formed from the carrier layer 18 of the first wafer 12, where the gap 40 (illustrated in FIG. 6) is positioned within the handle layer 42, as mentioned above.

Figure 11:
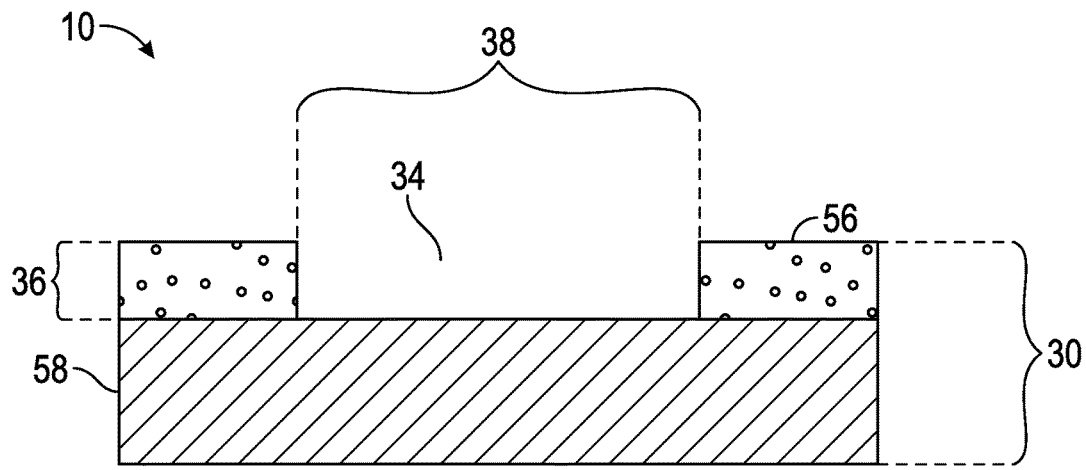
Figure 12:
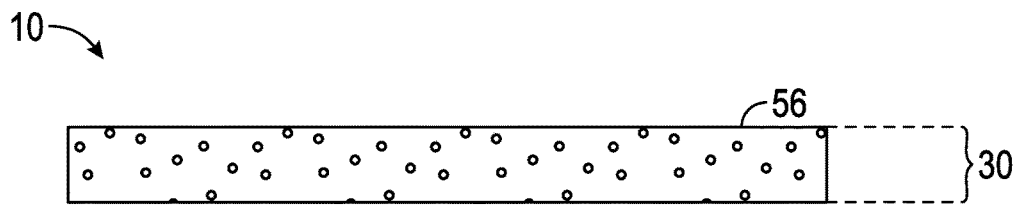

FIGS. 11 and 12 illustrate various other embodiments of the second wafer 30. In FIG. 11, the second wafer 30 includes a handle semiconductor layer 56 overlying a handle insulator layer 58. The channel 34 is formed in the handle semiconductor layer 56 such that the handle insulator layer 58 is exposed at a bottom of the channel 34. In alternate embodiments, the channel 34 may not pass completely through the handle semiconductor layer 56, or the channel 34 may penetrate part of the way into the handle insulator layer 58 in yet other embodiments. FIG. 12 illustrates an embodiment where the second wafer 30 includes a handle semiconductor layer 56 but no handle insulator layer 58, and the second wafer 30 does not include a channel because the channel may be present in the first wafer 12 (as illustrated in FIG. 10.) The various illustrated embodiments of the first and second wafers 12, 30 as well as other embodiments that are not illustrated, can be directly bonded together as described above in essentially any combination where the channel 34 is positioned at the bonding surfaces such that the channel 34 forms a gap (illustrated in FIG. 6.)

Figure 13:
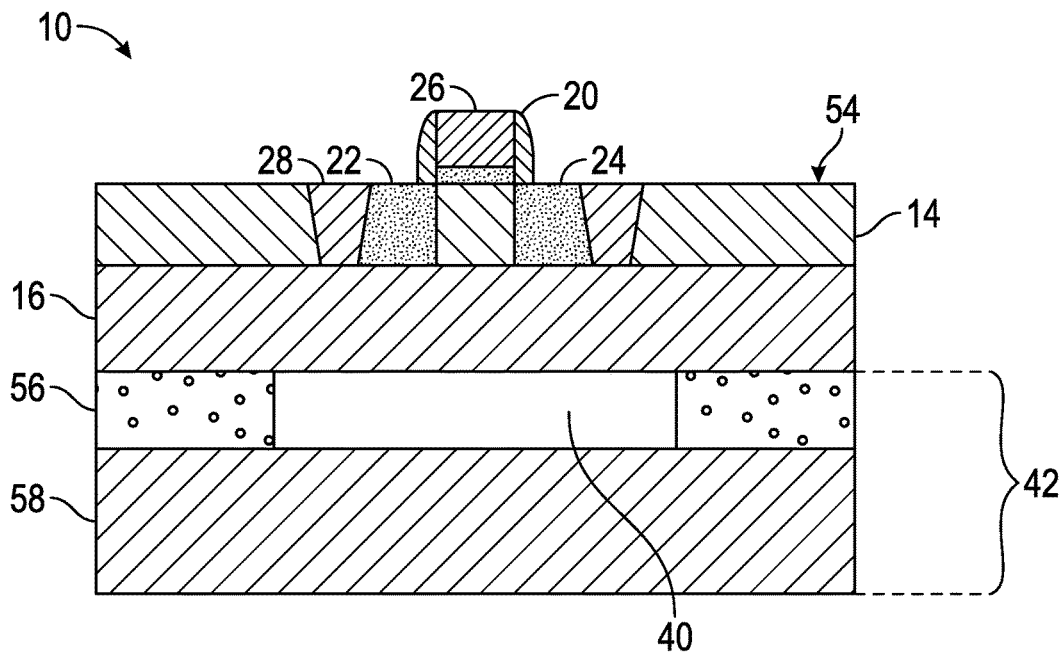
Figure 14:
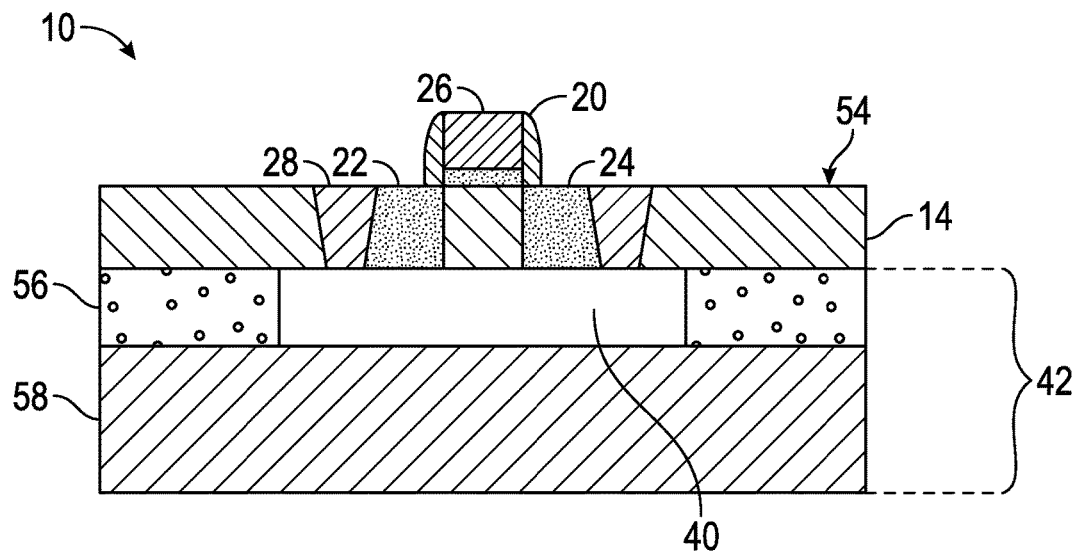
Figure 15:
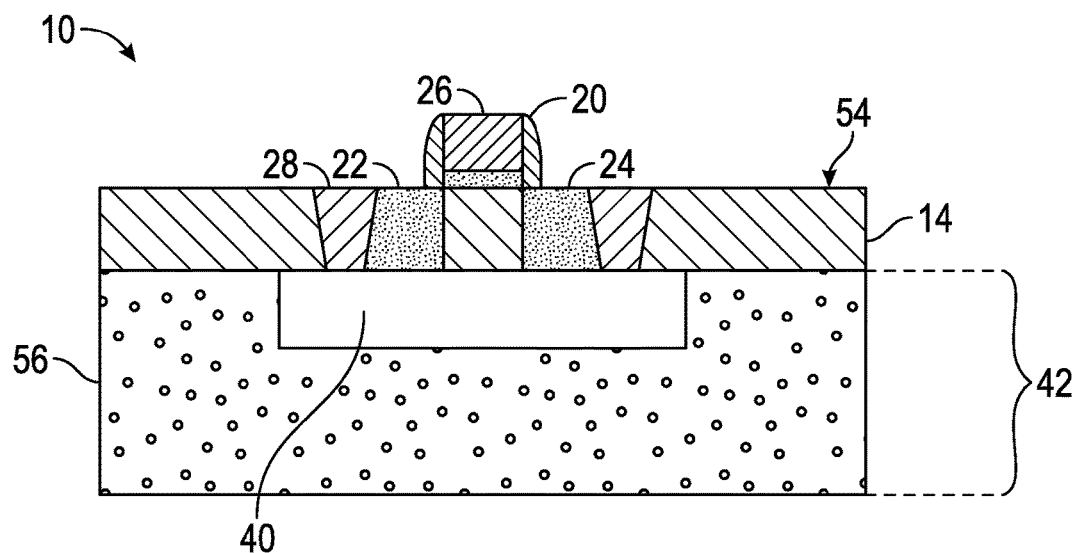
Figure 16:
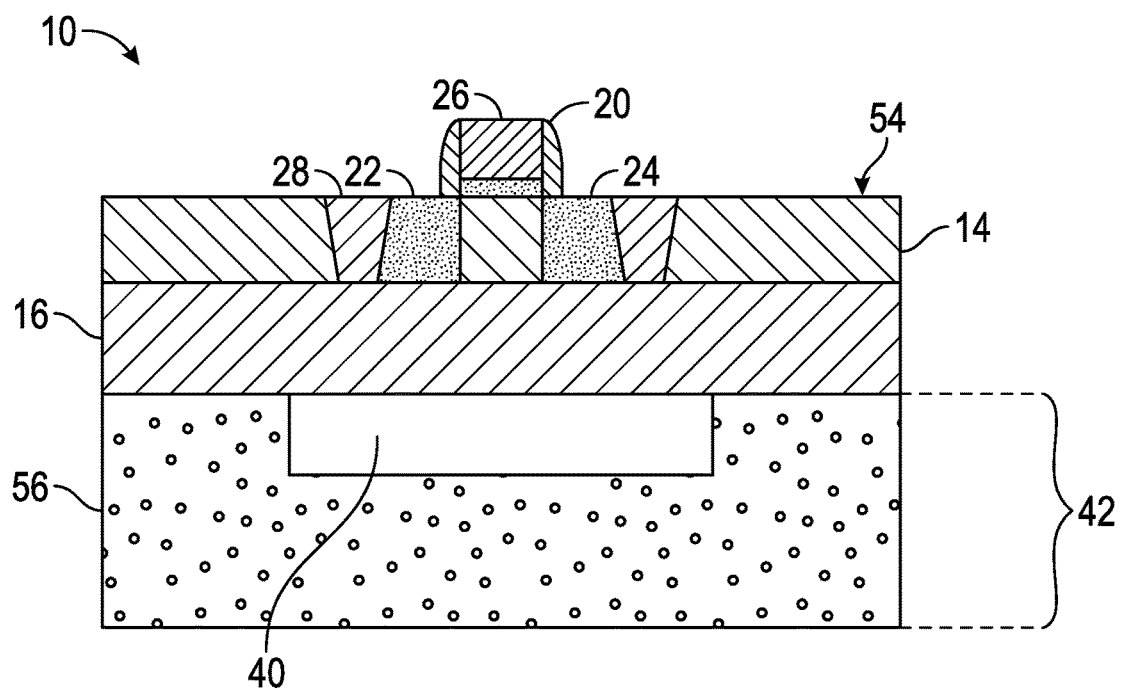

FIGS. 13, 14, 15, and 16 illustrate other exemplary embodiments of the integrated circuit 10 formed from the various embodiments of the first and second wafers 12, 30 illustrated above. FIG. 13 illustrates a combination of the first wafer 12 illustrated in FIG. 2 and the second wafer 30 illustrated in FIG. 11. FIG. 14 illustrates an integrated circuit 10 formed from the first wafer 12 illustrated in FIG. 8 and the second wafer 30 illustrated in FIG. 11. In the integrated circuit 10 illustrated in FIG. 14, the source 22 and drain 24 of the switch 20 extend completely through the working layer 14 such that the source 22 and drain 24 form a portion of the upper gap surface 44. In the embodiments illustrated in FIGS. 13 and 14 the handle layer 42 includes a handle semiconductor layer 56 and a handle insulator layer 58, where the handle insulator layer 58 underlies the gap 40. As such, in FIGS. 13 and 14 the handle semiconductor layer 56 defines the gap side surfaces 46 and the handle insulator layer 58 defines the lower gap surface 48. FIG. 15 illustrates an integrated circuit 10 formed from the first wafer 12 illustrated in FIG. 8 and the second wafer 30 illustrated in FIG. 4. FIG. 16 illustrates an integrated circuit 10 formed from the first wafer 12 illustrated in FIG. 10 and the second wafer 30 illustrated in FIG. 12. FIG. 16 does not illustrate a seam where the first and second wafers 12, 30 are directly bonded, so the handle layer 42 includes some material from the second wafer 30 and some material from the carrier layer 18 of the first wafer 12. Other embodiments of the integrated circuit 10 are also possible based on different combinations of the illustrated first and second wafers 12, 30 or based on combinations of first and/or second wafers 12, 30 that are not illustrated herein.

Figure 17:
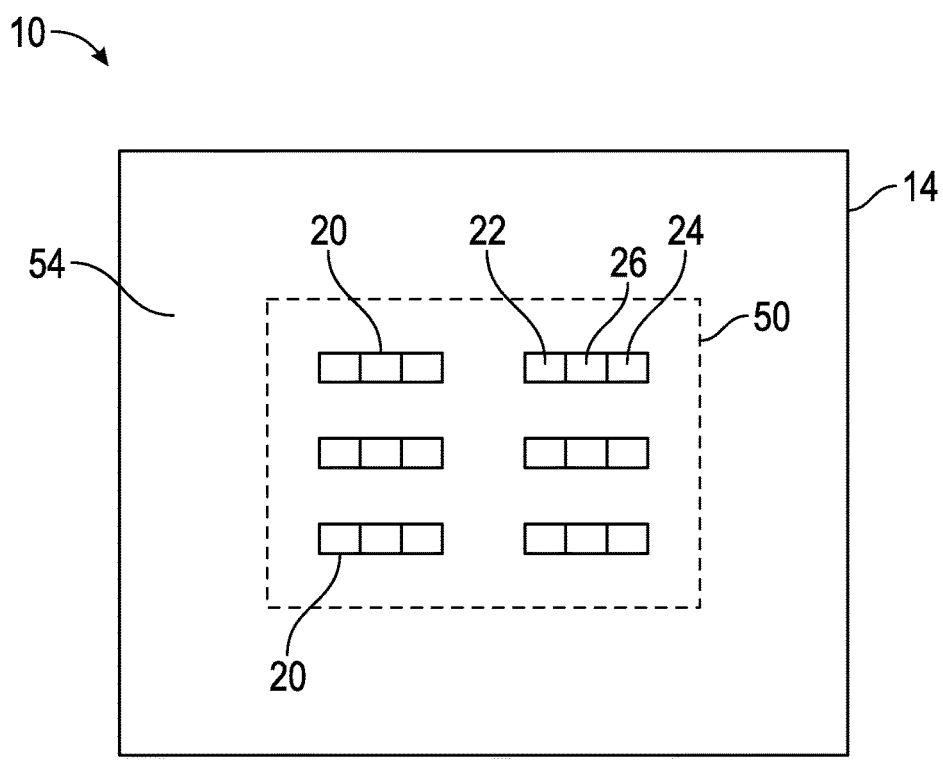
FIG. 17 illustrates a top view of a portion of the integrated circuit and methods for its fabrication in accordance with an exemplary embodiment.

FIG. 17. illustrates a top view of an integrated circuit with a plurality of switches 20, where the gap area 50 is illustrated with a dashed line. As can be seen, each of the plurality of switches 20 entirely overlies the gap area 50 of a single gap (illustrated in FIG. 6). The entirety of the plurality of switches 20 and the associated switch areas (illustrated in FIG. 7) overlie the singe gap in the illustrated embodiment, because none of the plurality of switches 20 extend beyond the dashed line representing the gap area 50. The high resistivity of the gap may electrically isolate all of the plurality of switches quite effectively, so a plurality of gaps are not required to individually isolate each switch 20. As such, highly precise alignment the first and second wafers 12, 30 (illustrated in FIG. 5) during the direct bonding process may not be required.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
    a working layer comprising a semiconductor substrate;
    a buried oxide layer underlying the working layer;
    a handle layer underlying the buried oxide layer, wherein the handle layer defines a gap underlying the buried oxide layer, wherein the gap comprises an upper gap surface and a lower gap surface, and wherein the handle layer comprises a handle semiconductor layer and a handle insulator layer; and
    a switch overlying the buried oxide layer, wherein the switch comprises a source, a drain, and a gate, and wherein the entire switch directly overlies the gap.

2. The integrated circuit of claim 1 wherein the gap comprises gap side surfaces formed from the handle layer, and wherein the lower gap surface is formed from the handle layer.

3. The integrated circuit of claim 1 wherein the switch comprises a field effect transistor.

4. The integrated circuit of claim 3 wherein the field effect transistor comprises the source and the drain, wherein the source extends completely through the working layer and the drain extends completely through the working layer.

5. The integrated circuit of claim 1 wherein the switch comprises a plurality of switches directly overlying one gap.

6. The integrated circuit of claim 5 wherein an entirety of the plurality of switches directly overlie one gap.

7. The integrated circuit of claim 1 wherein the handle insulator layer underlies the gap.

8. The integrated circuit of claim 7 wherein the handle semiconductor layer defines gap side surfaces and the handle insulator layer defines a gap bottom surface.

9. The integrated circuit of claim 1 further comprising a gap gas positioned within the gap, wherein the gap gas comprises air.

* * * * *